United States Patent
Sutardja et al.

(10) Patent No.: US 9,112,133 B2
(45) Date of Patent: Aug. 18, 2015

(54) RESISTIVE RANDOM ACCESS MEMORY AND METHOD FOR CONTROLLING MANUFACTURING OF CORRESPONDING SUB-RESOLUTION FEATURES OF CONDUCTIVE AND RESISTIVE ELEMENTS

(71) Applicant: Marvell World Trade Ltd., St. Michael (BB)

(72) Inventors: Pantas Sutardja, Los Gatos, CA (US); Albert Wu, Palo Alto, CA (US); Runzi Chang, San Jose, CA (US); Winston Lee, Palo Alto, CA (US); Peter Lee, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 70 days.

(21) Appl. No.: 14/102,922

(22) Filed: Dec. 11, 2013

(65) Prior Publication Data
US 2014/0170832 A1    Jun. 19, 2014

Related U.S. Application Data

(60) Provisional application No. 61/737,512, filed on Dec. 14, 2012.

(51) Int. Cl.
*H01L 21/20* (2006.01)
*H01L 45/00* (2006.01)
*H01L 27/24* (2006.01)

(52) U.S. Cl.
CPC ............ *H01L 45/04* (2013.01); *H01L 27/2436* (2013.01); *H01L 27/2463* (2013.01); *H01L 45/1233* (2013.01); *H01L 45/1675* (2013.01)

(58) Field of Classification Search
CPC .. H01L 45/04; H01L 45/1675; H01L 27/2436
USPC ........................................................ 438/382
See application file for complete search history.

(56) References Cited

U.S. PATENT DOCUMENTS

| 8,288,752 | B2 * | 10/2012 | Park | 257/5 |
| 2012/0119181 | A1 * | 5/2012 | Oh et al. | 257/4 |
| 2012/0315737 | A1 * | 12/2012 | Kang | 438/381 |

* cited by examiner

*Primary Examiner* — Bradley K Smith

(57) ABSTRACT

A method including: forming a stack of resistive layers; prior to or subsequent to forming the stack of resistive layers, forming a conductive layer; applying a mask layer on the stack of resistive layers or the conductive layer; forming a first spacer on the mask layer; and etching away a first portion of the mask layer using the first spacer as a first mask to provide a remainder. The method further includes: forming a second spacer on the stack of the resistive layers or the conductive layer and the remainder of the mask layer; etching away a second portion of the remainder of the mask layer to form an island; and using the island as a second mask, etching the stack of the resistive layers to form a resistive element of a memory, and etching the conductive layer to form a conductive element of the memory.

20 Claims, 17 Drawing Sheets

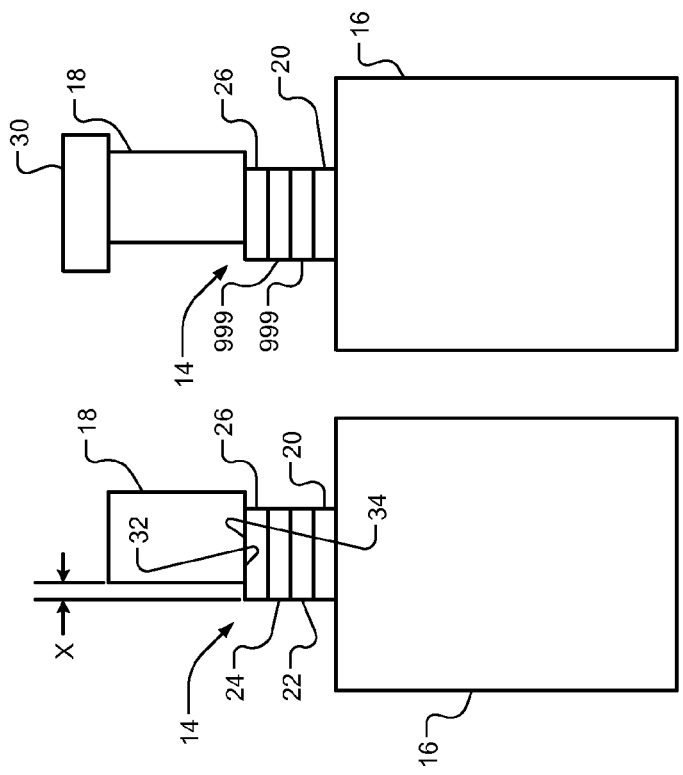
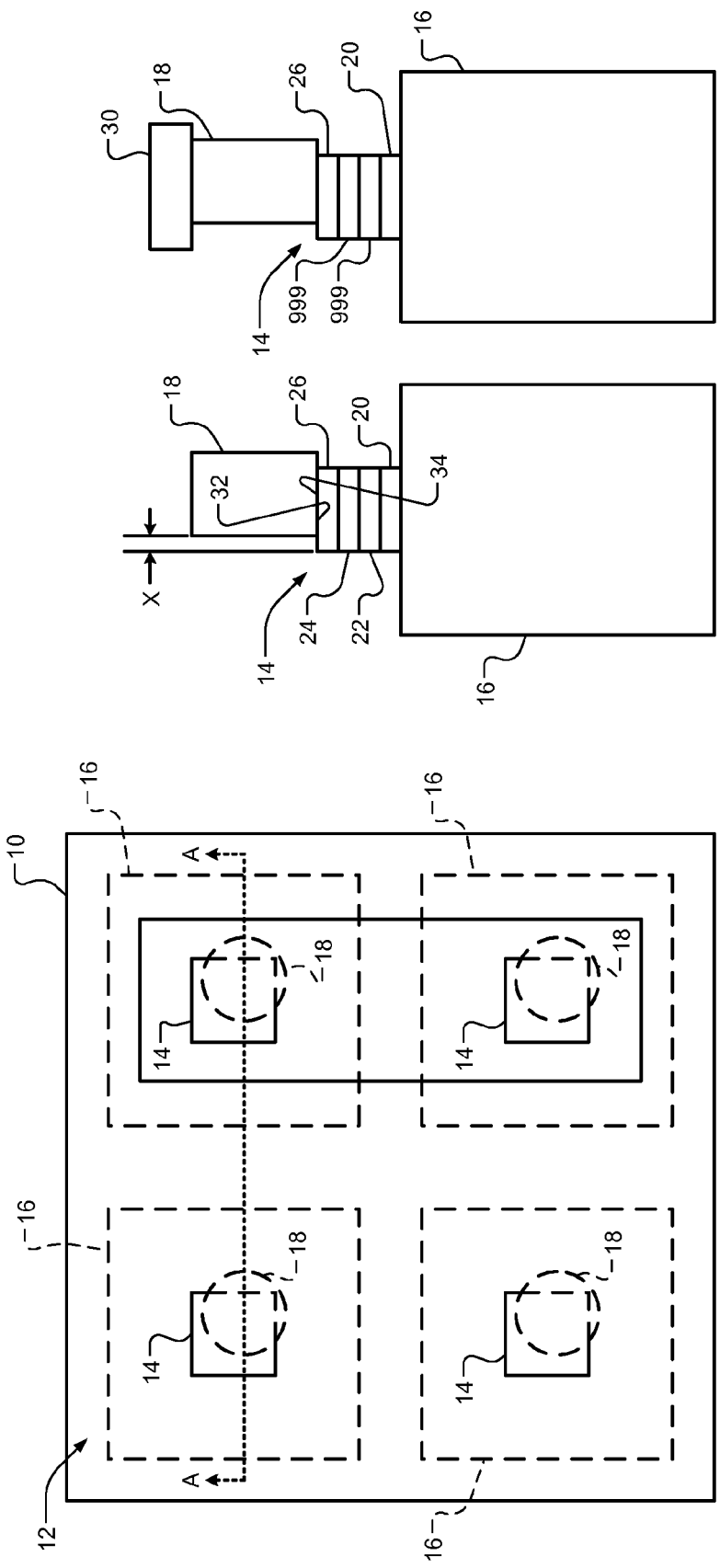
FIG. 2
Prior Art
FIG. 1
Prior Art

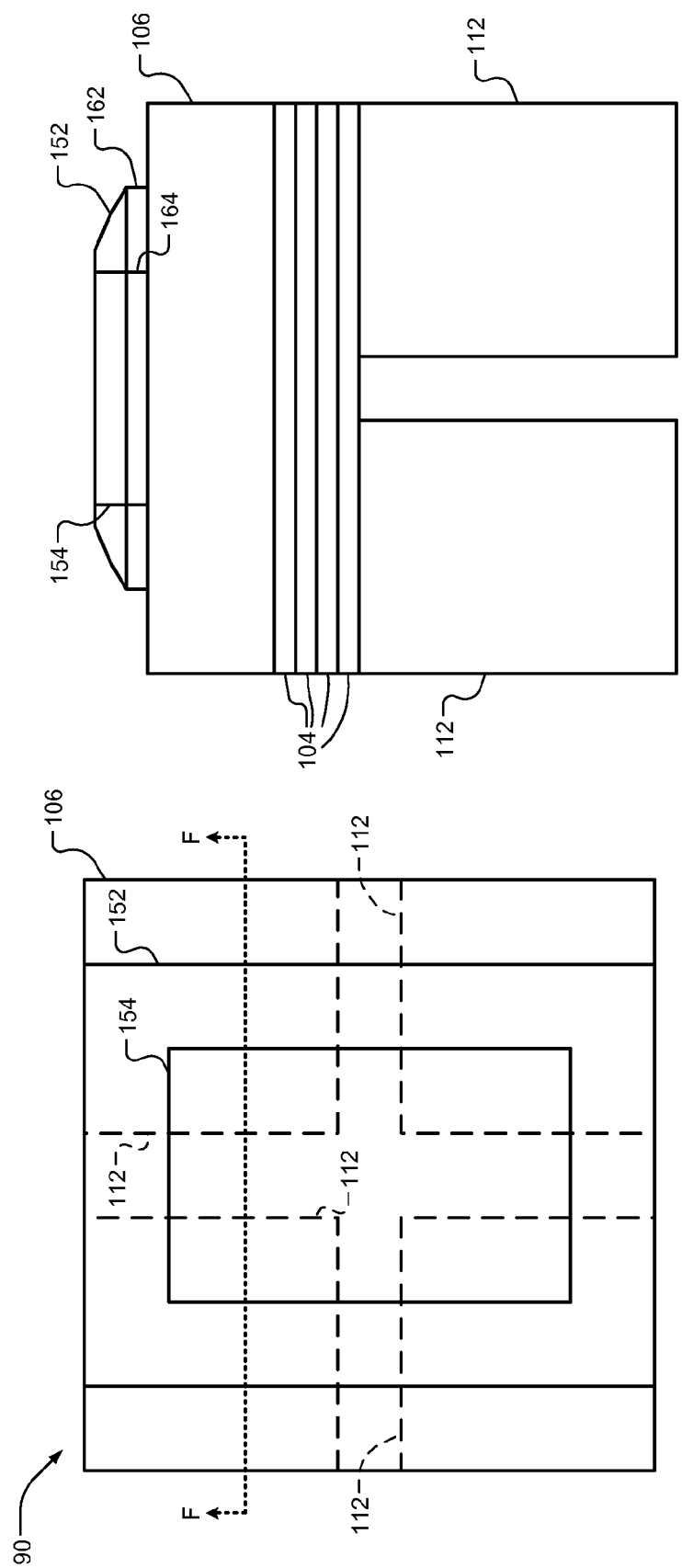

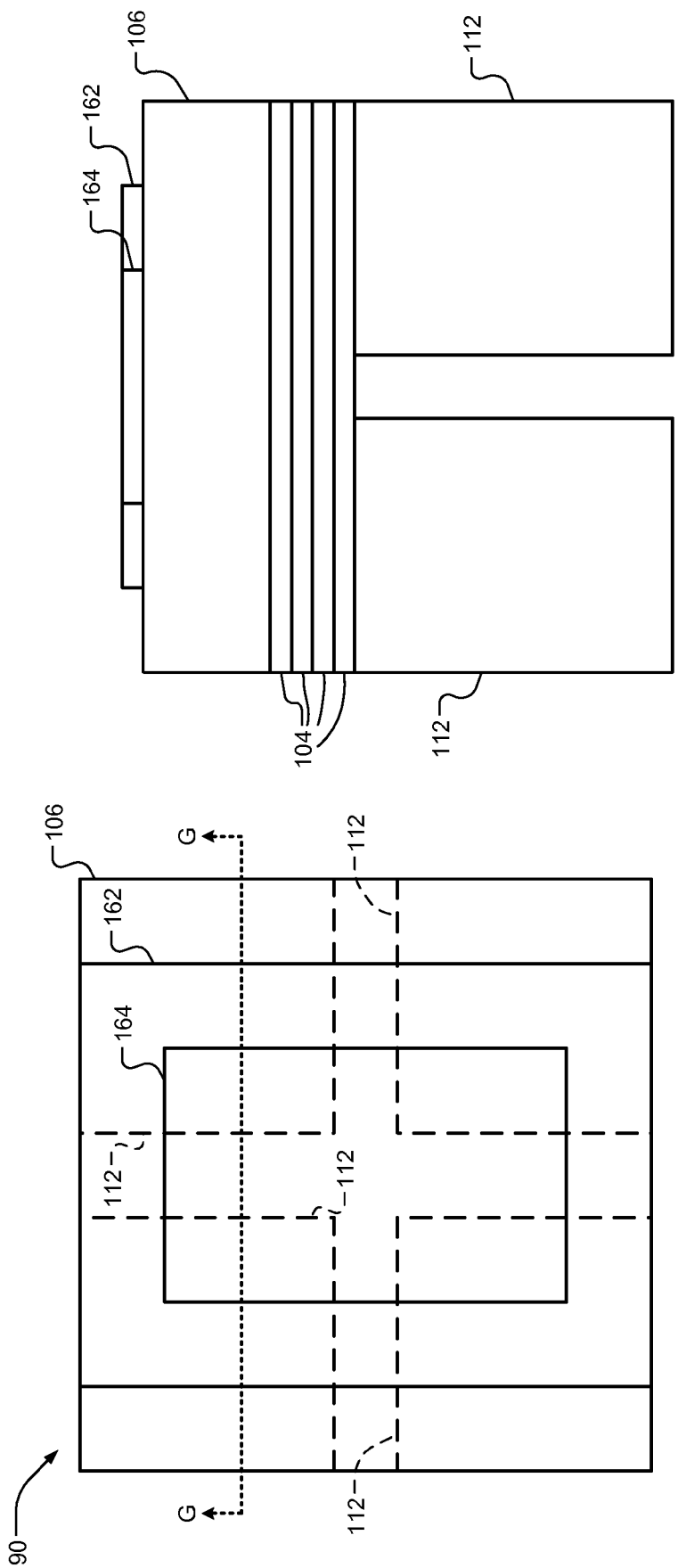

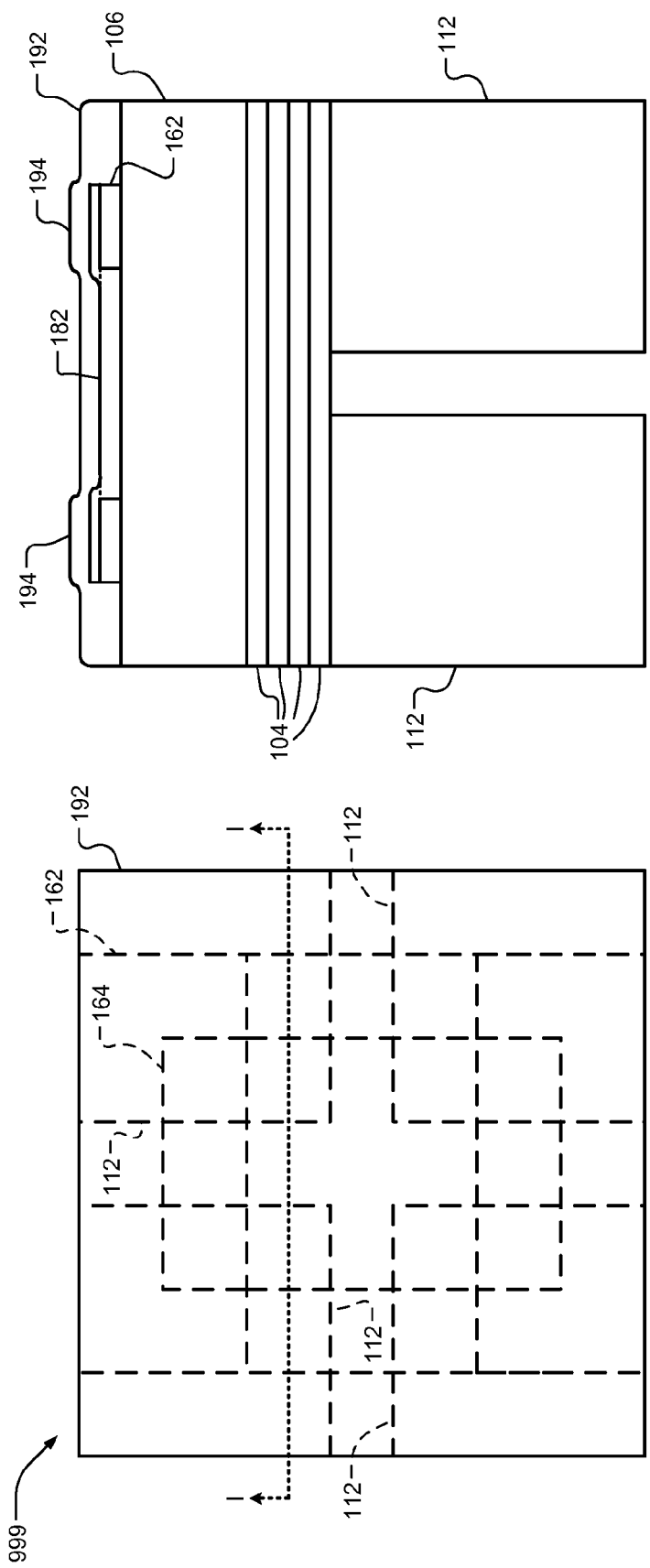

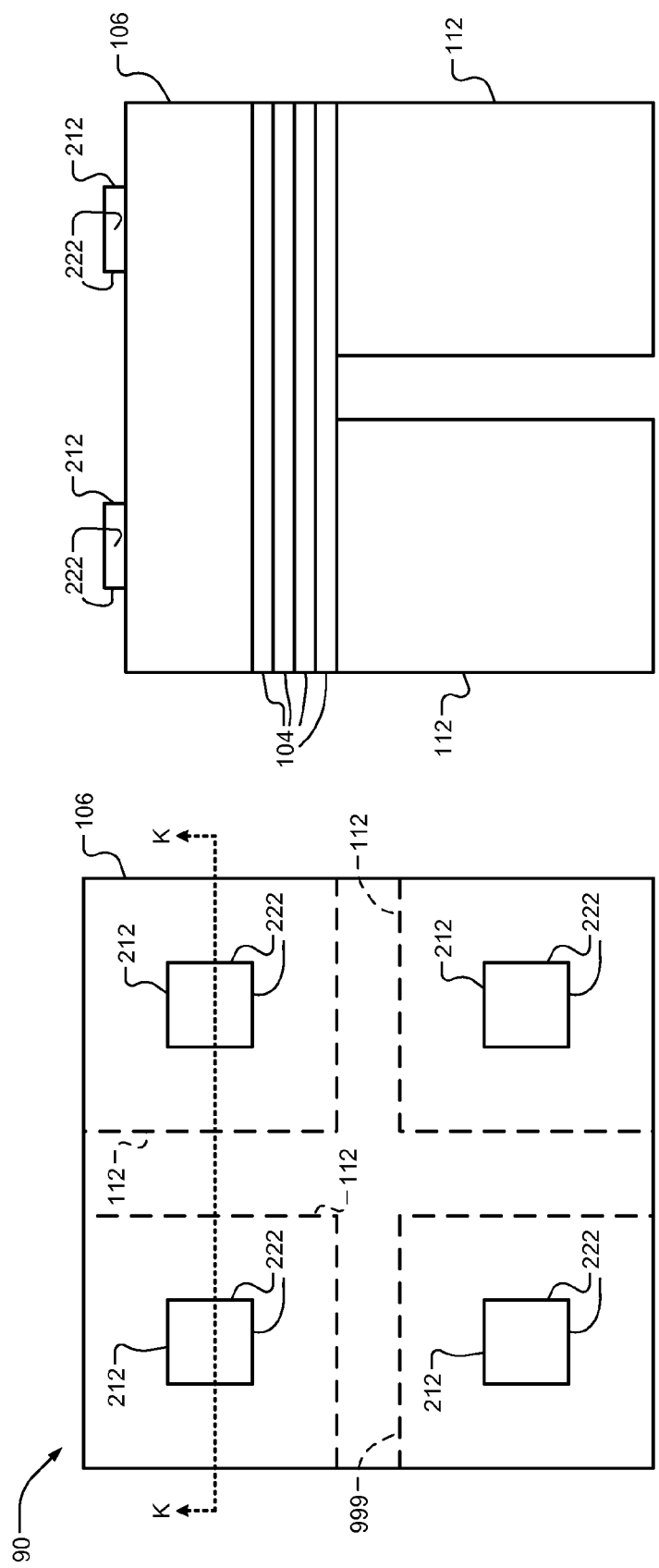

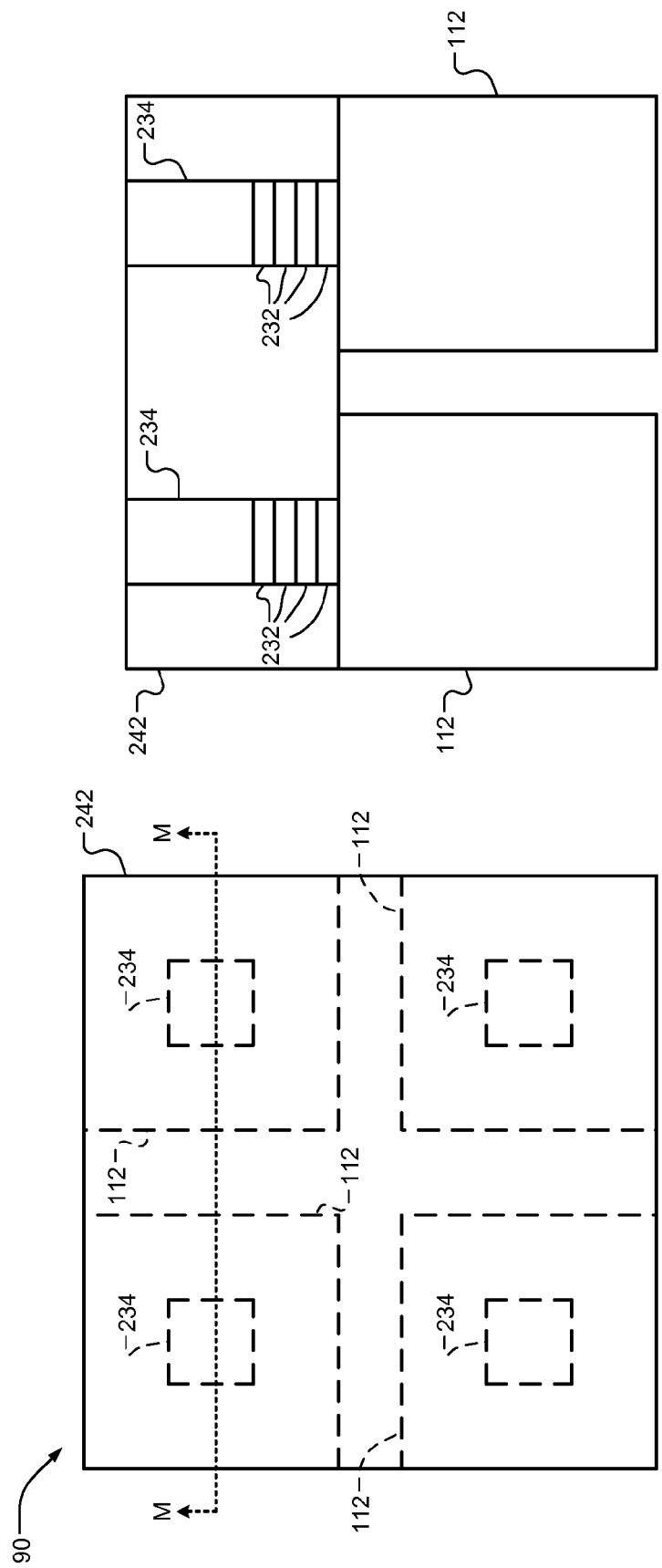

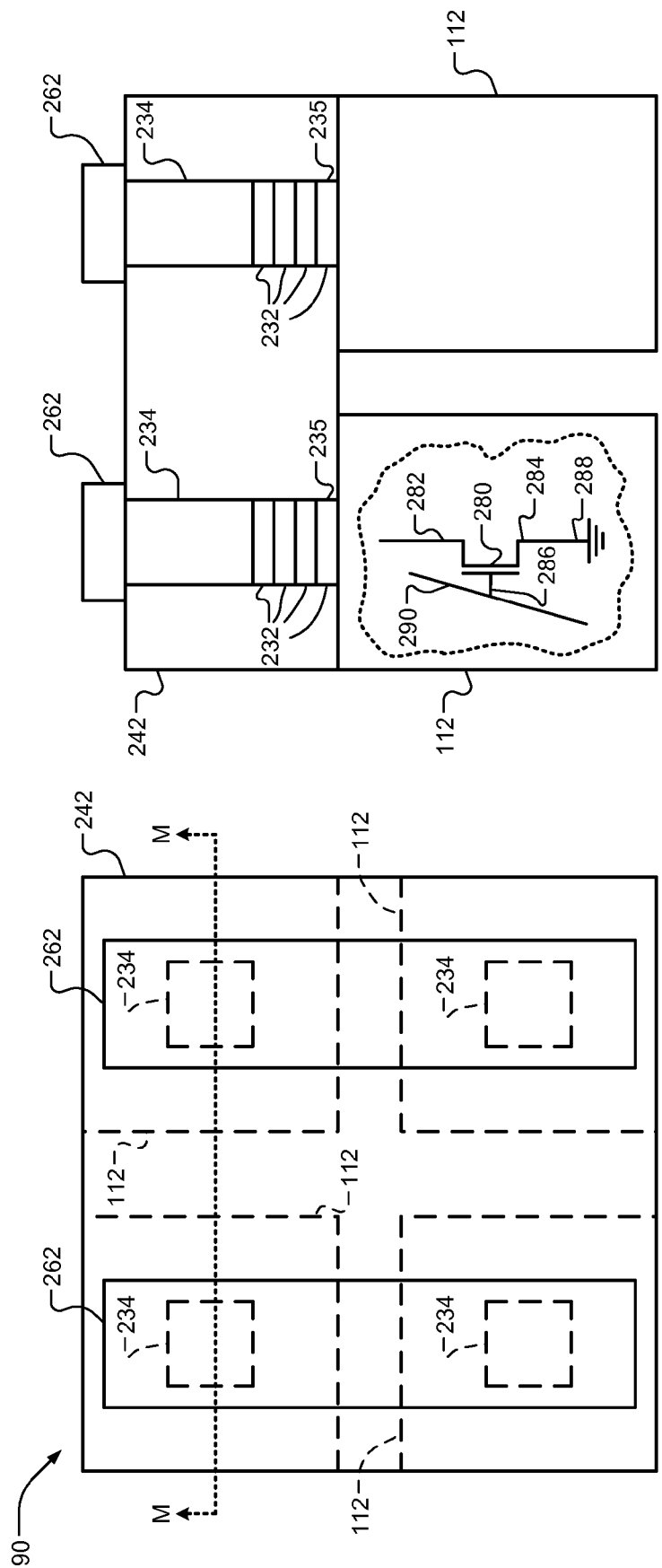

RESISTIVE RANDOM ACCESS MEMORY AND METHOD FOR CONTROLLING MANUFACTURING OF CORRESPONDING SUB-RESOLUTION FEATURES OF CONDUCTIVE AND RESISTIVE ELEMENTS

CROSS-REFERENCE TO RELATED APPLICATIONS

This application claims the benefit of U.S. Provisional Application No. 61/737,512, filed on Dec. 14, 2012. The entire disclosure of the application referenced above is incorporated herein by reference.

FIELD

The present disclosure relates to resistive random access memory (RRAM) and methods of manufacturing RRAM.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Random access memory (RAM) is a form of computer data storage in which data stored in a random access device can be accessed directly in any random order. There are various types of RAM including resistive random access memory (RRAM). FIGS. 1-2 show a resistive random access memory (RRAM) 10 that includes an array 12 of memory cells provided by resistive elements 14. The resistive elements 14 may be accessed by access devices 16. The access devices 16 may include, for example, complementary metal-oxide-semiconductor (CMOS) transistors, bipolar junction transistors (BJTs), diodes, etc. Each of the resistive elements 14 has a corresponding conductive element 18 (e.g., a via or a contact). Each resistive element 14 may be referred to as a stack and include a first (or bottom) electrode 20, a variable resistive layer 22, a gettering layer 24, and a second (or top) electrode 26. The variable resistive layers 22 may include, for example, a transitional metal oxide. The gettering layers 24 may include, for example, a reactive metal. The conductive elements 18 are implemented as conductive layers on the stacks 14. The conductive elements 18 may be disposed between (i) the access devices 16 and (ii) the stacks 14. Alternatively, the conductive elements 18 may be disposed on an opposite side of the stacks 14 as the access devices 16. Two or more of the conductive elements 18 may be connected to each other by upper level interconnections (a single interconnection 30 is shown).

Traditionally, the resistive elements 14 and the conductive elements 18 are patterned using miniaturization methods, such as electron-beam lithography or extreme ultraviolet (EUV) lithography, which include the use of a photoresist. These methods employ low-throughput techniques, which include separately patterning the resistive elements 14 and conductive elements 18 using respective masks and etching processes. The methods result in element misalignment and element mismatching between the resistive elements 14 and the conductive elements 18.

Element misalignment refers to lateral misalignment between a conductive element and a resistive element, as shown by misalignment difference X in FIG. 1. Element mismatching refers to differences in shapes and edges of a conductive element and a corresponding resistive element. Due to the lithography techniques used, the resistive elements 14 and the conductive elements 18 have (i) rough and/or jagged edges, and (ii) contact surfaces with different shapes. For example, first contact surfaces 32 of the resistive elements 14 have a different shape than second contact surfaces 34 of the conductive elements 18. Thus, the first contact surfaces 32 do not match the second contact surfaces 34. The different shapes of the resistive elements 14 and the conductive elements 18 are represented in FIG. 1 by squares for the resistive elements 14 and by circles for the conductive elements 18. The actual shapes of the resistive elements 14 and the conductive elements 18 may be different and are typically irregular. The element misalignment and element mismatching increases resistances associated with the resistive elements 14 and the conductive elements 18 and can negatively affect performance of the RRAM 10.

SUMMARY

A method is provided and includes: forming a stack of resistive layers; prior to or subsequent to forming the stack of resistive layers, forming a conductive layer; applying a mask layer on (i) the stack of resistive layers, or (ii) the conductive layer; forming a first spacer on the mask layer; and etching away a first portion of the mask layer using the first spacer as a first mask to provide a remainder. The method further includes: forming a second spacer on (i) the stack of the resistive layers or the conductive layer, and (ii) the remainder of the mask layer; etching away a second portion of the remainder of the mask layer to form an island; and using the island as a second mask, (i) etching the stack of the resistive layers to form a resistive element of a memory, and (ii) etching the conductive layer to form a conductive element of the memory.

In other features, a method is provided and includes: forming a stack of resistive layers on access devices; applying a conductive layer on the stack of the resistive layers; applying a mask layer on the conductive layer; forming spacers on the mask layer; etching the mask layer using the spacers as first masks to provide islands; and using the islands as second masks, (i) etching the stack of the resistive layers to form resistive elements, and (ii) etching the conductive layer to form conductive elements, where the resistive elements provide memory cells.

In other features, a memory is provided and includes resistive elements and conductive elements. The resistive elements provide an array of memory cells, where the resistive elements include first contact surfaces. The conductive elements include vias or contacts. The conductive elements include second contact surfaces. The, resistive elements are in contact with respective ones of the conductive elements to provide element pairs. The element pairs have been etched during a same period of time using a single mask for each of the element pairs. The second contact surfaces match and are in alignment with respective ones of the first contact surfaces as a result of the etching of the element pairs.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

FIG. 1 is a top view of a traditional RRAM.

FIG. 2 is a cross-sectional side view through section line A-A of FIG. 1.

FIG. 12 is a top view of a portion of the RRAM subsequent to etching a portion of the hard mask layer.

FIG. 13 is a cross-sectional side view through section line F-F of FIG. 12.

FIG. 14 is a top view of a portion of the RRAM subsequent to removing a remainder of the second film layer to provide a first spacer.

FIG. 15 is a cross-sectional side view through section line G-G of FIG. 14.

FIG. 18 is a top view of a portion of the RRAM subsequent to formation of a fourth film layer to provide a second spacer.

FIG. 19 is a cross-sectional side view through section line I-I of FIG. 18.

FIG. 24 is a top view of a portion of the RRAM subsequent to etching the fourth film layer to provide a remainder of the hard mask layer in the form of islands.

FIG. 25 is a cross-sectional side view through section line L-L of FIG. 24.

FIG. 30 is a top view of a portion of the RRAM subsequent to removing a portion of the isolation layer and hard mask layer islands.

FIG. 31 is a cross-sectional side view through section line O-O of FIG. 30.

FIG. 32 is a top view of a portion of the RRAM subsequent to forming interconnections.

FIG. 33 is a cross-sectional side view through section line P-P of FIG. 32.

In the drawings, reference numbers may be reused to identify similar and/or identical elements.

DESCRIPTION

Methods are disclosed herein that include formation of resistive elements (or stacks) and conductive elements (e.g., vias or contacts) of RRAM. The methods include formation of spacers and the patterning (or etching) of resistive layers and conductive layers during a single step. The resistive layers and conductive layers are patterned together using a single formed mask. The formed spacers are used to provide the mask. The mask is then used to pattern the resistive layers and the conductive layers. This patterning provides control of sub-resolution features of the resistive elements and the conductive elements. Sub-resolution features refer to features that are smaller than resolution limits of a feature patterning tool. Sub-resolution features of the resistive elements and the conductive elements may include, for example, size, shape, and roughness of the edges of the resistive elements and the conductive elements. The methods include etching and chemical vapor deposition (CVD) instead of using traditional lithography and photoresist techniques. This minimizes and/or eliminates element misalignment and element mismatching. As a result, the resistive elements and conductive elements are in alignment and have matching contact surfaces. This minimizes corresponding resistances, improves reliability and increases performance of the RRAM.

Figure 3:
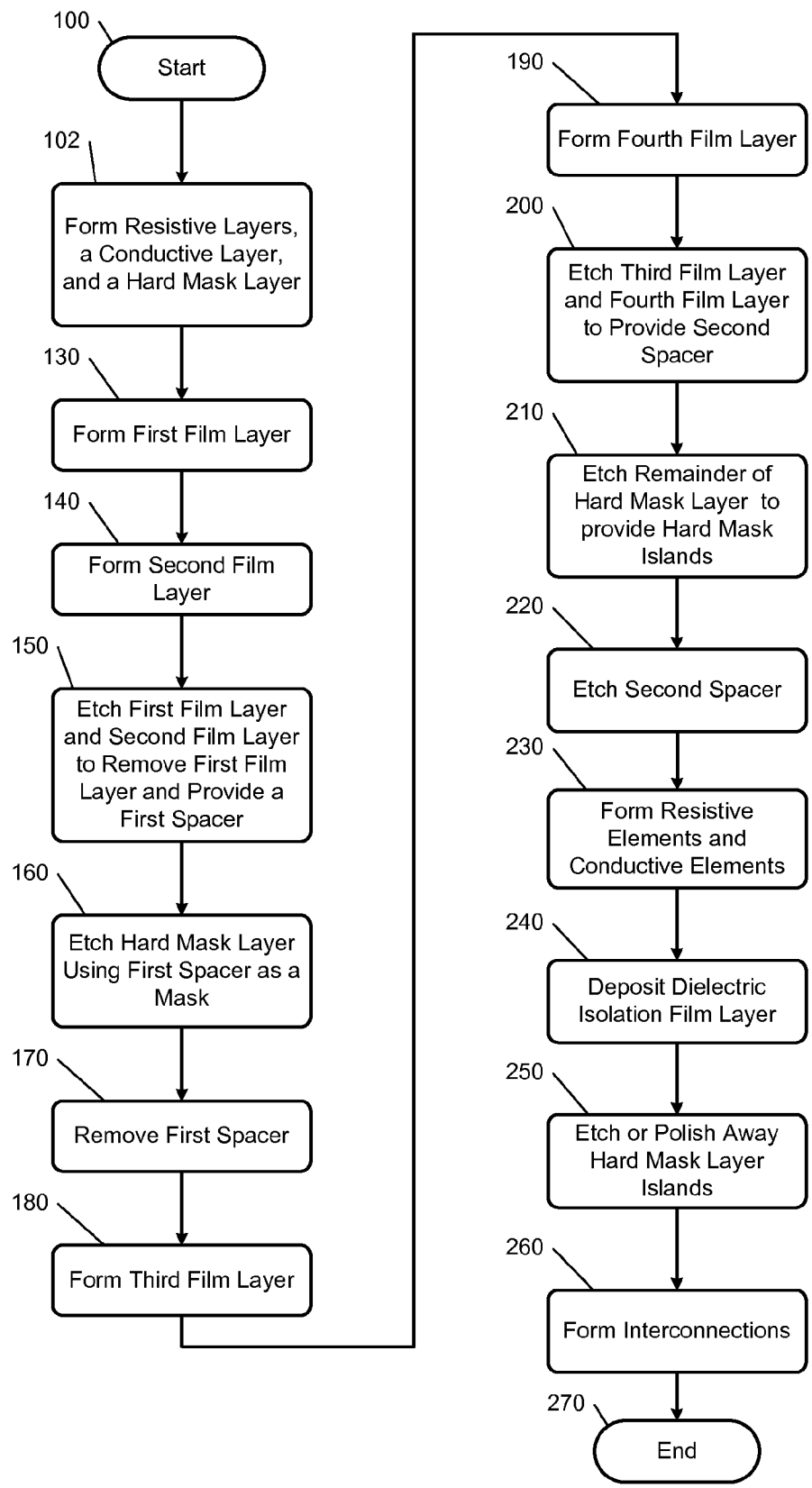
FIG. 3 illustrates a method of manufacturing a RRAM including corresponding resistive elements and conductive elements in accordance with multiple embodiments of the present disclosure.

FIG. 3 illustrates a method for manufacturing a RRAM including corresponding resistive elements and conductive elements. Although the following tasks are primarily described with respect to the implementations of FIGS. 4-33, the tasks may be easily modified to apply to other implementations of the present disclosure. The method begins at 100.

Figure 5:
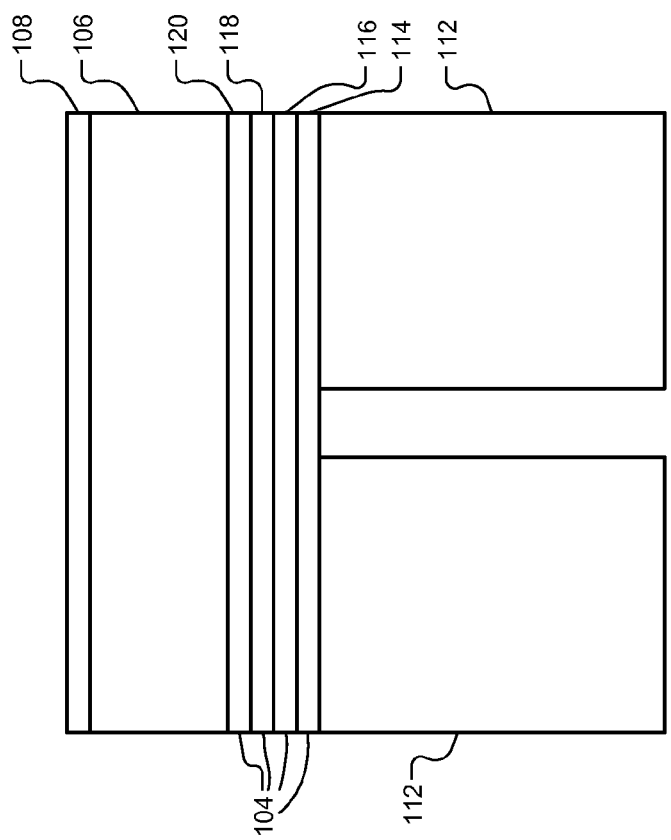
FIG. 5 is a cross-sectional side view through section line B-B of FIG. 4.
Figure 4:
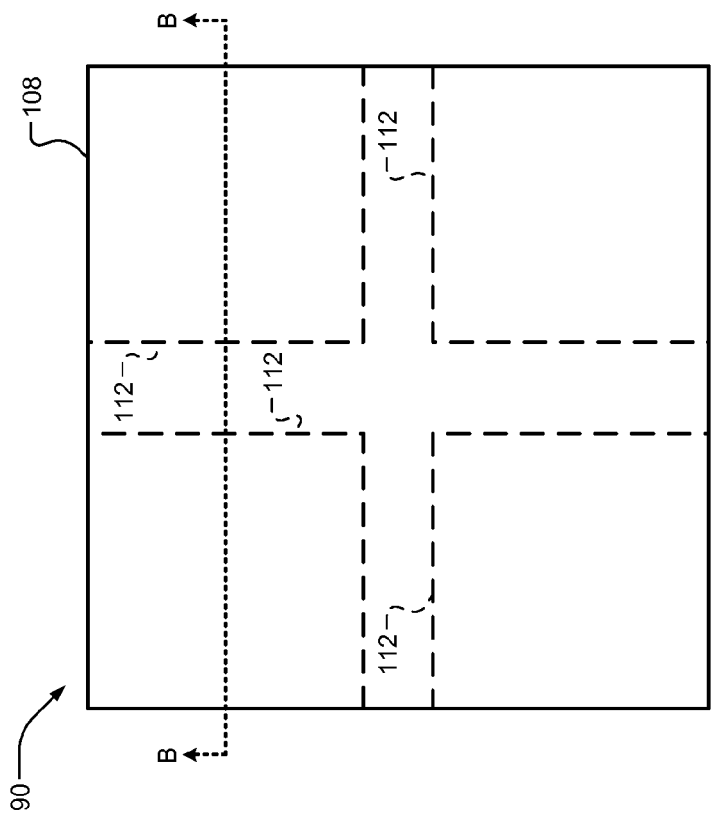
FIG. 4 is a top view of a portion of the RRAM subsequent to initial formation of resistive layers, a conductive layer and a hard mask layer.

In accordance to FIG. 3, FIGS. 4-5 show top and cross-sectional views of a state of a portion 90 of the RRAM subsequent to task 102. At 102, resistive layers 104, a conductive layer 106 and a hard mask layer 108 are formed on an array 110 of access devices 112 (in FIGS. 4-5 and in the following figures each box identified as 112 may include multiple access devices). The access devices 112 may include, for example, transistors (e.g., CMOS transistors and/or BJT transistors), diodes, word lines, conductive elements (e.g., wires, vias, contacts, etc.), or other electronic components. This is further described with respect to FIGS. 32-33.

The resistive layers 104 may be film layers which are deposited and applied on the access devices to form a stack. The resistive layers 104 may include a first (or bottom) electrode layer 114, a variable resistive layer 116, gettering layer 118, and a second (or top) electrode layer 120. The electrode layers 114, 120 may be formed of and/or include, for example, titanium nitride TiN. In one implementation, the second electrode layer 120 is etched in subsequent tasks to provide electrodes, which may be connected to bit lines. The variable resistance layer 116 may be formed of and/or include, for example, a transitional metal oxide (e.g., hafnium oxide $HfO_2$). The gettering layer 118 may be formed of and/or include, for example, a reactive metal (e.g., Ti). The conductive layer 106 may be deposited on the stack of resistive layers 104 and may be formed of and/or include, for example, Ti, aluminum Al, and/or tungsten W. The hard mask layer 108 may be deposited on the conductive layer 106 and may be formed of and/or include, for example, silicon nitride $Si_3N_4$ and/or TiN. The conductive layer 106 may be thicker than one or more of each of (i) the resistive layers 104, and (ii) the hard mask layer 108. The hard mask layer 108 may be thinner than one or more of each of (i) the resistive layers 104, and (ii) the conductive layer 106.

Although the conductive layer 106 is shown as being disposed between the resistive layers 104 and the hard mask layer 108, the conductive layer 106 may be disposed between the access devices 112 and the resistive layers 104. When disposed between the resistive layers 104 and the hard mask layer 108, the conductive layer 106 may be etched in subsequent tasks to provide vias. When disposed between the access devices 112 and the resistive layers 104, the conductive layer 106 may be etched in subsequent tasks to provide contacts.

Figure 7:
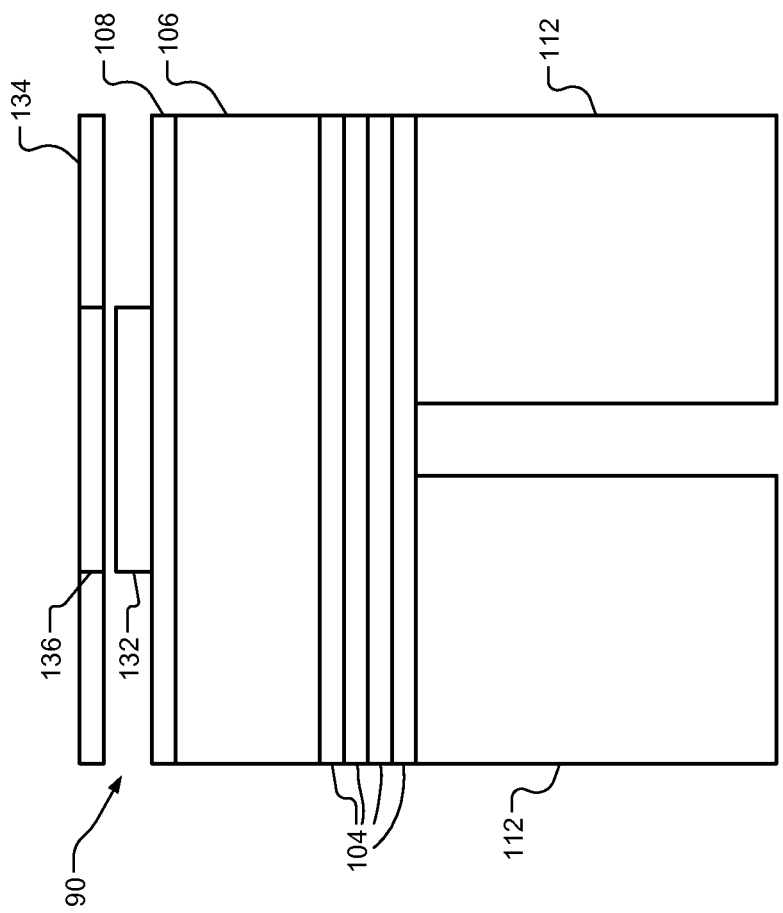
FIG. 7 is a cross-sectional side view through section line C-C of FIG. 6.
Figure 6:
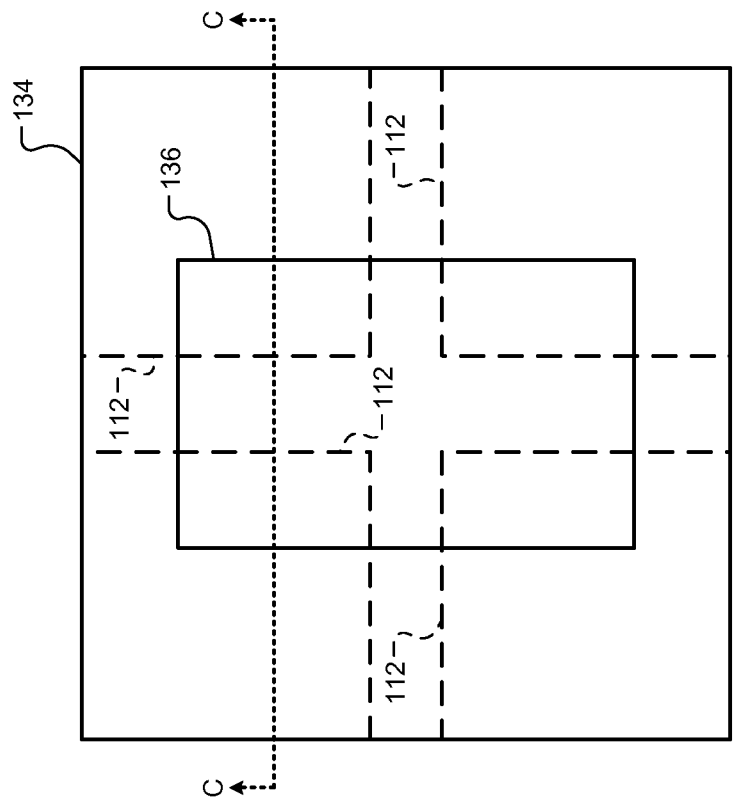
FIG. 6 is a top view of a first mask and a portion of the RRAM subsequent to formation of a first film layer.

In accordance to FIG. 3, FIGS. 6-7 show top and cross-sectional views of a state of the portion 90 of the RRAM subsequent to task 130. FIGS. 6-7 show the resistive layers 104, the conductive layer 106, the hard mask layer 108, the access devices 112, a first film layer 134, and a first mask 134. At 130, the first film layer 132 is formed. The first mask 134 has an opening 136 and may be used to form and pattern the first film layer 132. The first mask 134 may be provided or formed based on a predetermined layout of memory cells of the RRAM. The first film layer 132 may be deposited on the hard mask layer 108 using the first mask 134. CVD or other deposition technique, such as physical vapor deposition (PVD), may be used to form the first film layer 132. The first film layer 132 may be formed of and/or include, for example, silicon dioxide SiO$_2$ and/or silicon carbide SiC.

Figure 9:
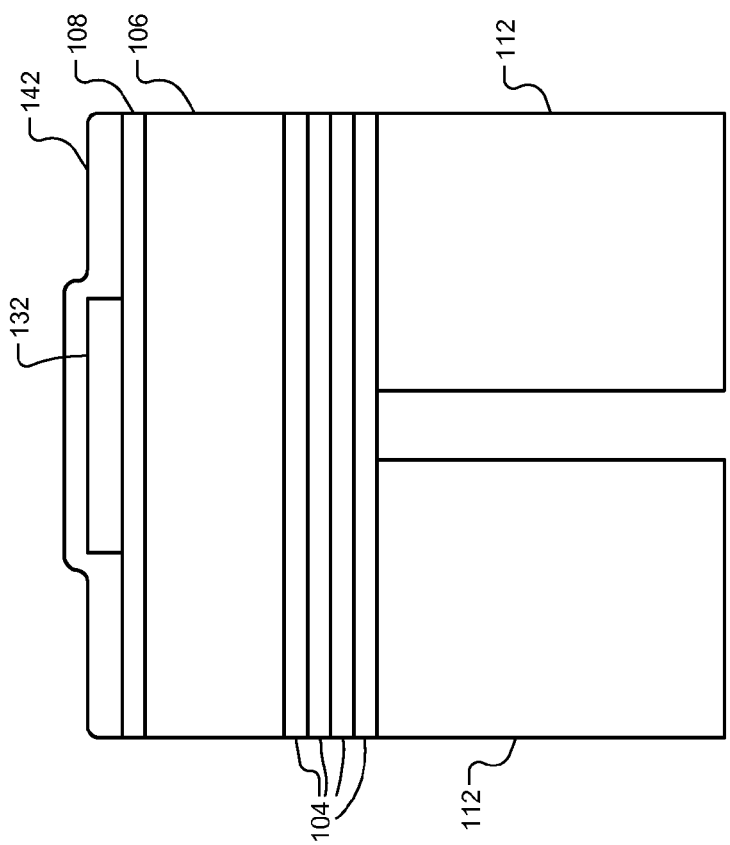
FIG. 9 is a cross-sectional side view through section line D-D of FIG. 8.
Figure 8:
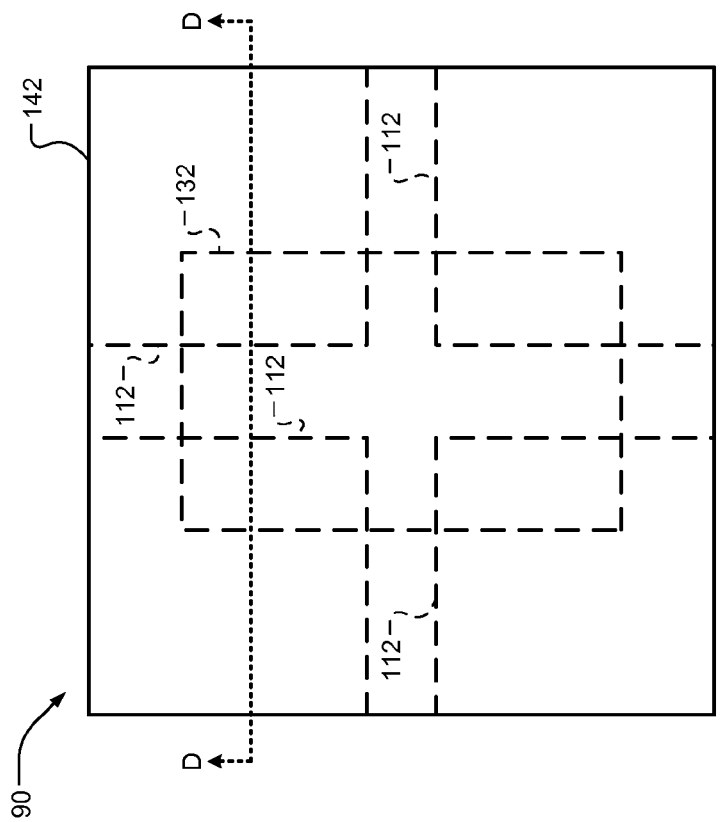
FIG. 8 is a top view of a portion of the RRAM subsequent to formation of a second film layer.

In accordance to FIG. 3, FIGS. 8-9 show top and cross-sectional views of a state of the portion 90 of the RRAM subsequent to task 140. FIGS. 8-9 show the resistive layers 104, the conductive layer 106, the hard mask layer 108, the access devices 112, the first film layer 132, and a second film layer 142. At 140, the second film layer 142 is applied over the first film layer 132 and the hard mask layer 108. The second film layer 142 may be deposited on the first film layer 132 and the hard mask layer 108 using CVD, PVD or other suitable deposition technique. The second film layer 142 is formed of a different material than the first film layer 132. The second film layer 142 may be formed of and/or include, for example, carbon doped silicon nitride Si$_3$N$_4$. By forming the second film layer 142 of a different material than the first film layer 132, the first film layer 132 can be removed while preserving at least a portion of the second film layer 142, as conducted in the following task 150.

Figure 11:
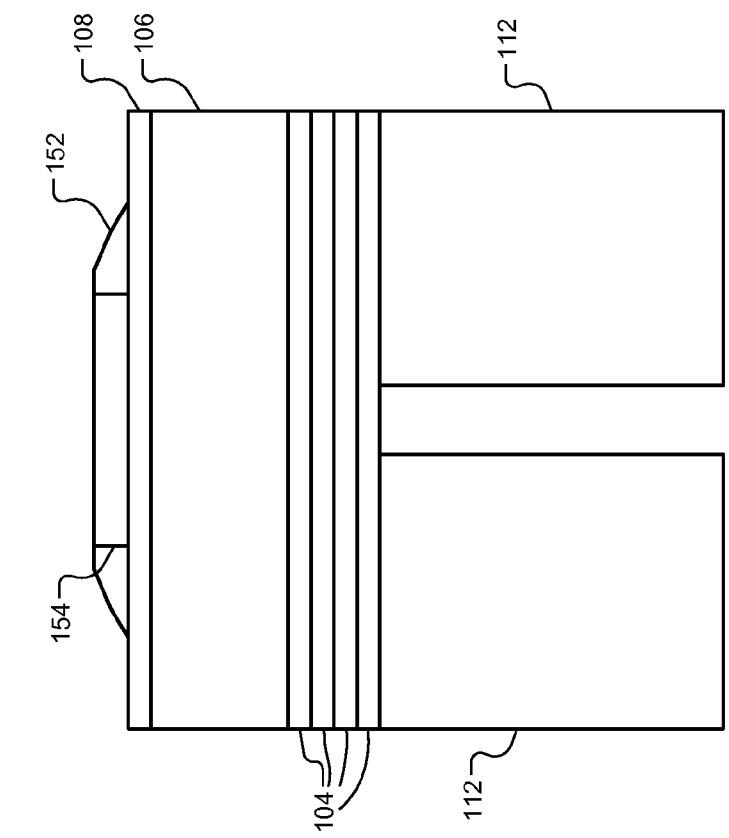
FIG. 11 is a cross-sectional side view through section line E-E of FIG. 10.
Figure 10:
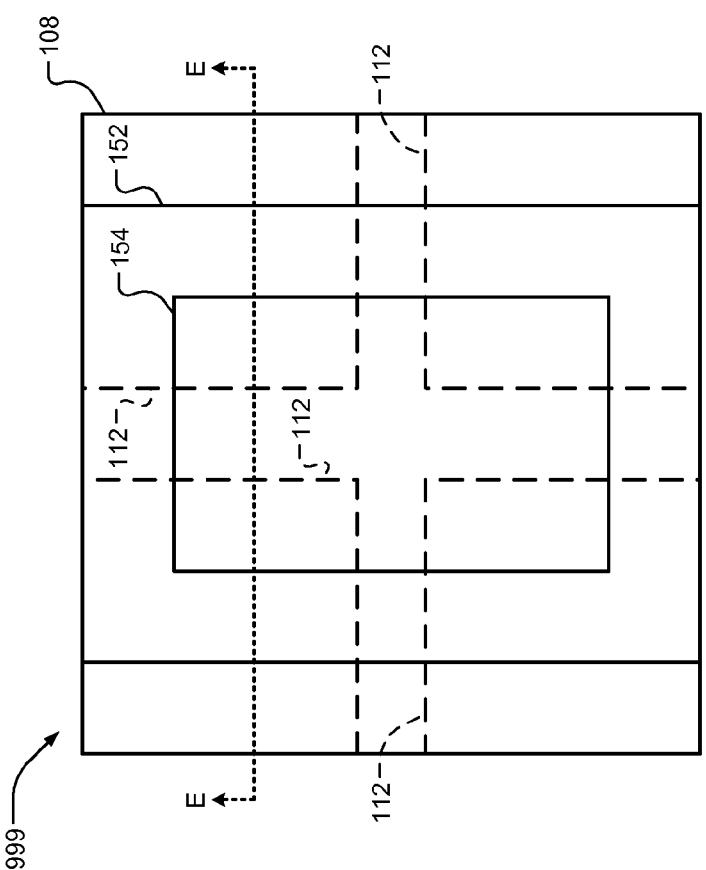
FIG. 10 is a top view of a portion of the RRAM subsequent to etching the second film layer.

In accordance to FIG. 3, FIGS. 10-11 show top and cross-sectional views of a state of the portion 90 of the RRAM subsequent to task 150. FIGS. 10-11 show the resistive layers 104, the conductive layer 106, the hard mask layer 108, the access devices 112, and a remainder 152 of the second film layer 142. At 150, the first film layer 132 and the second film layer 142 are etched to provide a first spacer 152 (i.e. the remainder of the second film layer 142). The first spacer 152 is the remainder of the second film layer 142 subsequent to etching the second film layer 142. The first film layer 132 has been removed. As a result the first spacer 152 is ring-shaped and has a center opening 154 where the first film layer 132 previously was located. Anisotropic etching may be used to remove the first film layer 132 and etch away a portion of the second film layer 142 to provide the first spacer 152. The etching performed at 150 may include wet or dry etching.

In accordance to FIG. 3, FIGS. 12-13 show top and cross-sectional views of a state of the portion 90 of the RRAM subsequent to task 160. FIGS. 12-13 show the resistive layers 104, the conductive layer 106, a remainder 162 of the hard mask layer 108, the access devices 112, and the first spacer 152. At 160, the hard mask layer 108 is etched using the first spacer 152 as a mask to provide the remainder 162. The remainder has a center opening 164. The remainder 162 is ring-shaped and matches the ring-shaped pattern of the first spacer 152. Anisotropic etching may be used to etch away a portion of the hard mask layer 108 to provide the remainder 162. The etching performed at 160 may include dry etching.

In accordance to FIG. 3, FIGS. 14-15 show top and cross-sectional views of a state of the portion 90 of the RRAM subsequent to task 160. FIGS. 14-15 show the resistive layers 104, the conductive layer 106, the remainder 162 of the hard mask layer 108, and the access devices 112. At 170, the first spacer 152 is removed. Anisotropic etching may be used to etch away the first spacer 152. The etching performed at 170 may include wet or dry etching.

Figure 17:
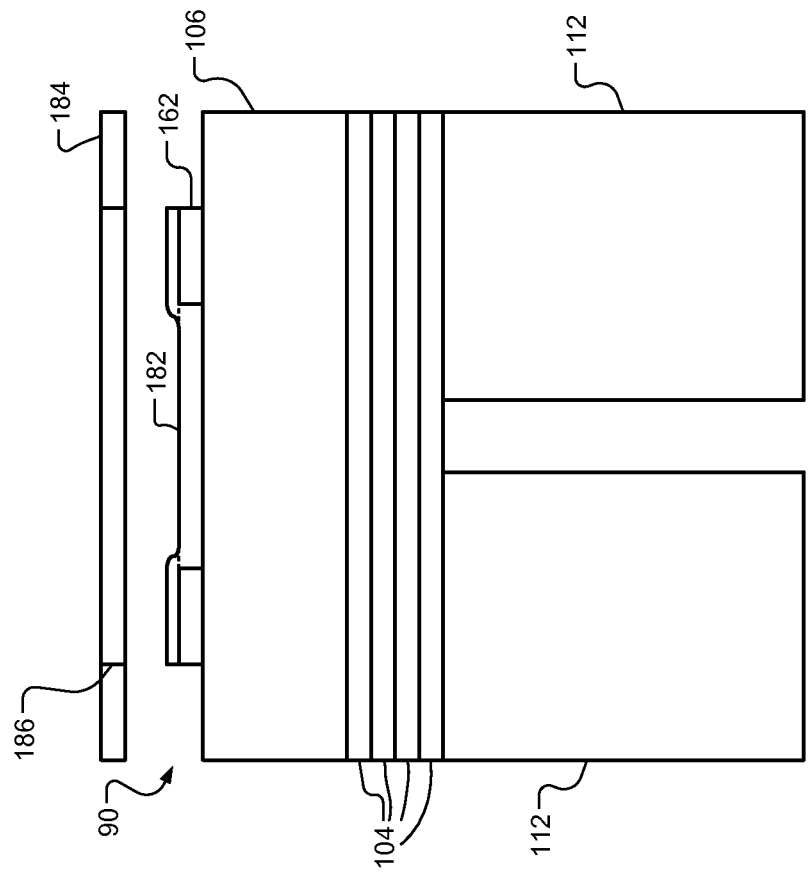
FIG. 17 is a cross-sectional side view through section line H-H of FIG. 16.
Figure 16:
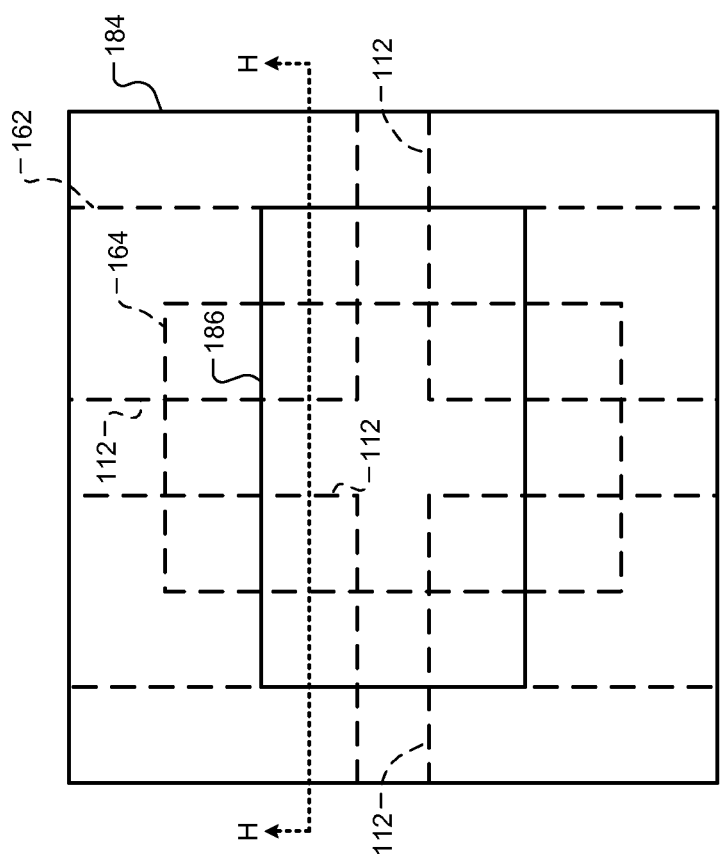
FIG. 16 is a top view of a second mask and a portion of the RRAM subsequent to formation of a third film layer.

In accordance to FIG. 3, FIGS. 16-17 show top and cross-sectional views of a state of the portion 90 of the RRAM subsequent to task 180. FIGS. 16-17 show the resistive layers 104, the conductive layer 106, the remainder 162 of the hard mask layer 108, the access devices 112, a third film layer 182, a third film layer 182, and a second mask 184. At 180, the third film layer 182 is formed. The second mask 184 having an opening 186 may be used to form and pattern the third film layer 182. The second mask 184 may be provided or formed based on a predetermined layout of memory cells. The third film layer 182 may be deposited on the conductive layer 106 and within the center opening 154 of the remainder 162 of the hard mask layer 108 using the second mask 184. The third film layer 182 may overlap portions of the remainder 162 of the hard mask layer 108. CVD or other deposition technique, such as physical vapor deposition (PVD) may be used to form the third film layer 182. The third film layer 182 may be formed of and/or include, for example, silicon dioxide SiO$_2$ and/or silicon carbide SiC.

In accordance to FIG. 3, FIGS. 18-19 show top and cross-sectional views of a state of the portion 90 of the RRAM subsequent to task 190. FIGS. 18-19 show the resistive layers 104, the conductive layer 106, the remainder 162 of the hard mask layer 108, the access devices 112, the third film layer 182, and a fourth film layer 192. At 190, a fourth film layer 192 is formed. The fourth film layer 192 may be deposited on the third film layer 182 and the conductive layer 106 using CVD, PVD or other suitable deposition technique. The fourth film layer 192 is formed of a different material than the third film layer 182. The fourth film layer 192 may be formed of and/or include, for example, carbon doped silicon nitride Si$_3$N$_4$. By forming the fourth film layer 192 of a different material than the third film layer 182, the first third film layer 182 can be removed while preserving at least a portion of the fourth film layer 192, as conducted in the following task 200. The fourth film layer 192 includes raised profile areas 194, due to the overlay of the fourth film layer on the portions of the third film layer 182 overlapping the remainder 162 of the hard mask layer 108.

Figure 21:
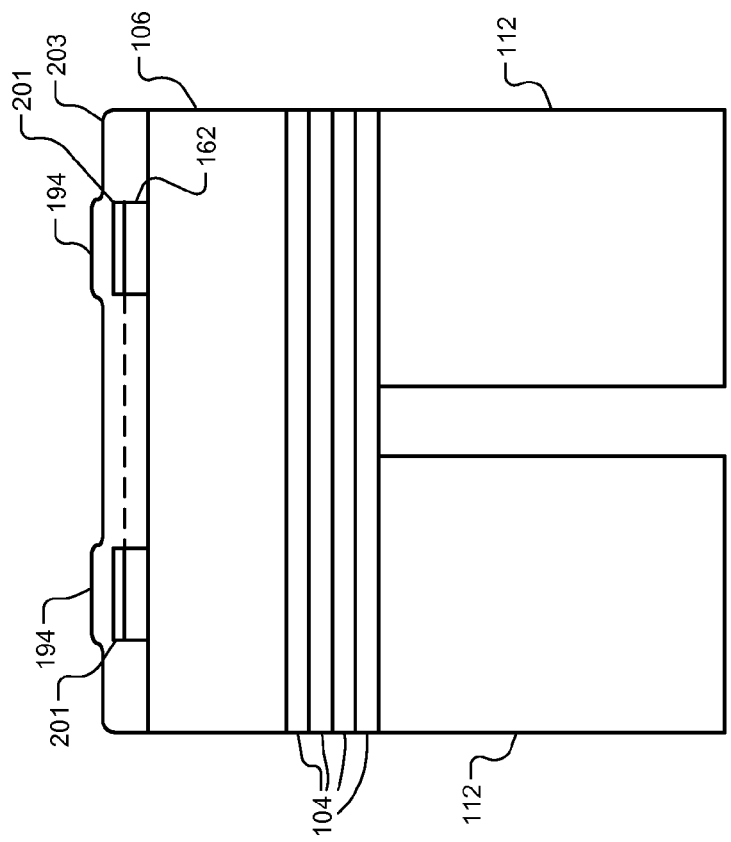
FIG. 21 is a cross-sectional side view through section line J-J of FIG. 20.
Figure 20:
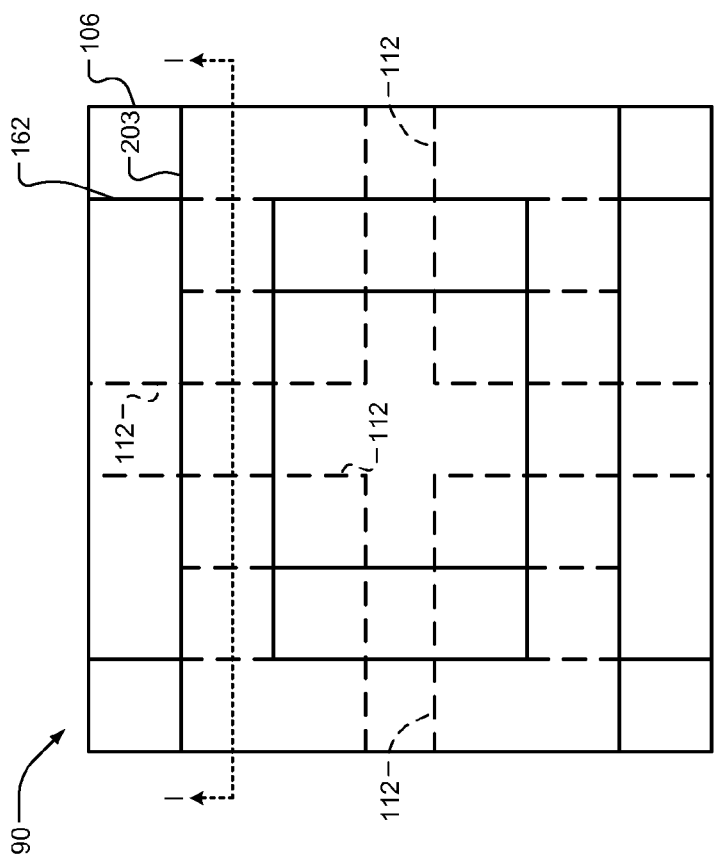
FIG. 20 is a top view of a portion of the RRAM subsequent to etching the fourth film layer and removing the third film layer.

In accordance to FIG. 3, FIGS. 20-21 show top and cross-sectional views of a state of the portion 90 of the RRAM subsequent to task 200. FIGS. 20-21 show the resistive layers 104, the conductive layer 106, the remainder 162 of the hard mask layer 108, the access devices 112, a remainder 201 of the third film layer 182, and a remainder 202 of the fourth film layer 192. At 200, the third film layer 182 and the fourth film layer 192 are etched to provide a second spacer 203 which includes the remainder 201 of the third film layer 182 and the remainder 202 of the fourth film layer 192. The second spacer 203 is ring-shaped. Each of the spacers 162, 203 are rectangular-shaped. The remainder 162 of the hard mask layer 108 extends in a first direction. The second spacer 203 extends in a second direction perpendicular to the first direction. Anisotropic etching may be used to etch the third film layer 182 and the fourth film layer 192 to provide the second spacer 203. The etching performed at 200 may include dry etching.

Figure 23:
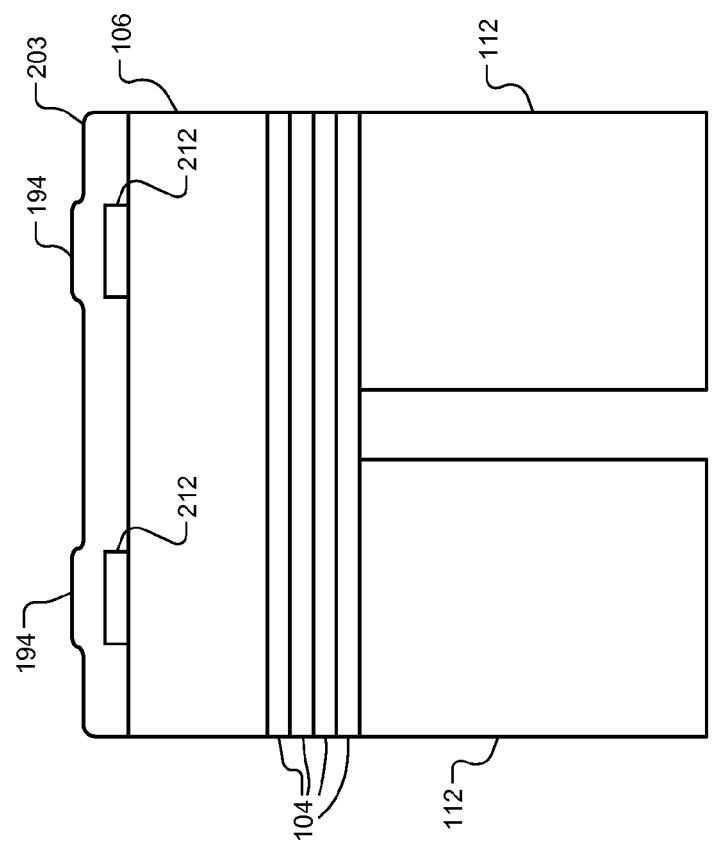
FIG. 23 is a cross-sectional side view through section line K-K of FIG. 22.
Figure 22:
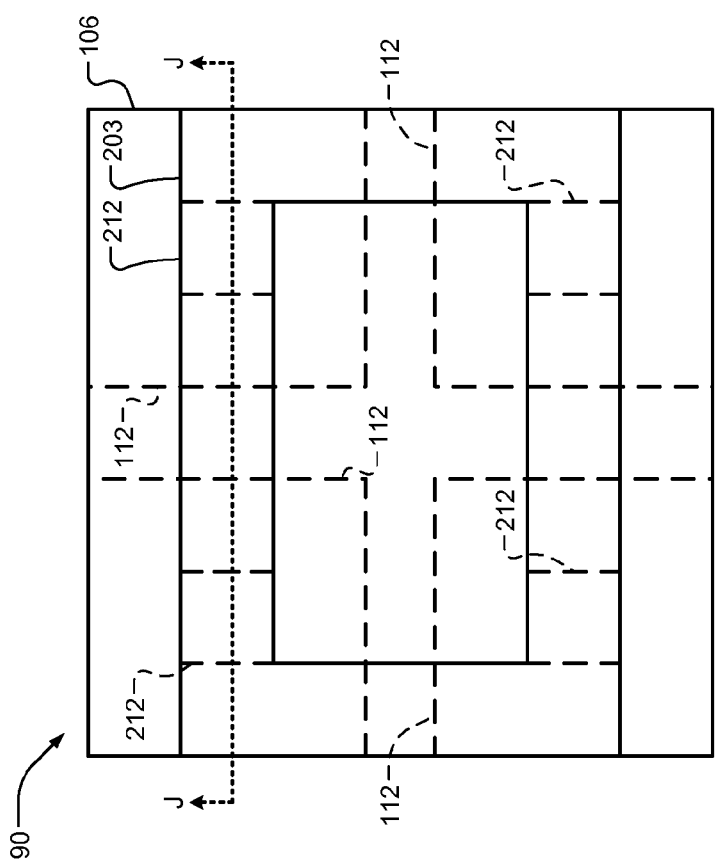
FIG. 22 is a top view of a portion of the RRAM subsequent to etching a remainder of the hard mask layer.

In accordance to FIG. 3, FIGS. 22-23 show top and cross-sectional views of a state of the portion 90 of the RRAM subsequent to task 210. FIGS. 22-23 show the resistive layers 104, the conductive layer 106, the access devices 112, the second spacer 203, and hard mask layer islands 212. At 210, the remainder 162 of the hard mask layer 108 (shown in FIGS. 20 and 21) is etched using the second spacer 203 as a mask to provide the hard mask layer islands 212. Anisotropic etching may be used to etch away a portion of the remainder 162 to provide the hard mask layer islands 212. The etching performed at 210 may include wet or dry etching.

In accordance to FIG. 3, FIGS. 24-25 show top and cross-sectional views of a state of the portion 90 of the RRAM subsequent to task 220. FIGS. 24-25 show the resistive layers 104, the conductive layer 106, the access devices 112, and the hard mask layer islands 212. At 220, the second spacer 203 is removed or (etched away) such that the remaining elements on the conductive layer 106 are the hard mask layer islands 212. Edges 222 of the hard mask layer islands 212 are smooth due to the previous multiple etching steps 160 and 210 and the use of the spacers 162, 203.

Figure 27:
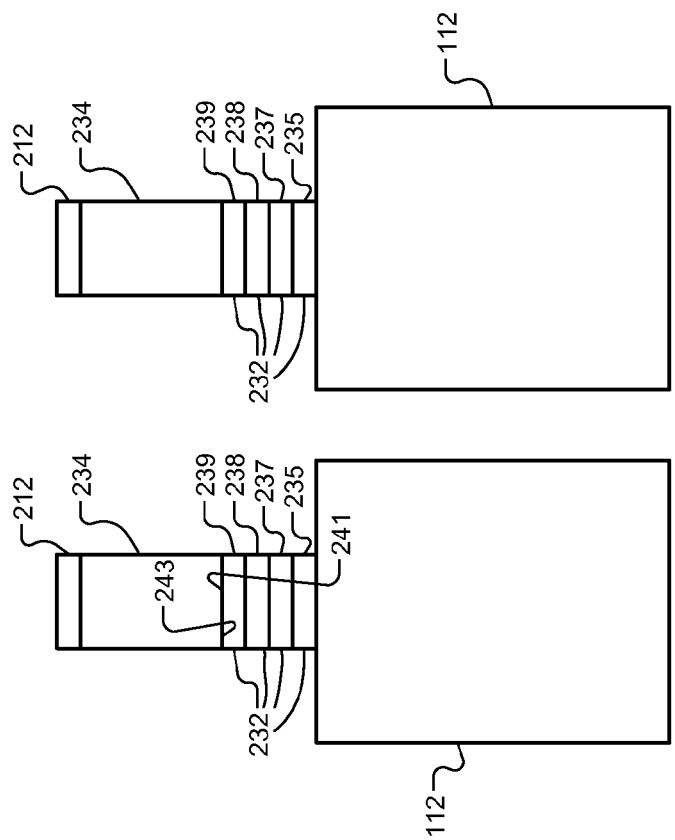
FIG. 27 is a cross-sectional side view through section line M-M of FIG. 26.
Figure 26:
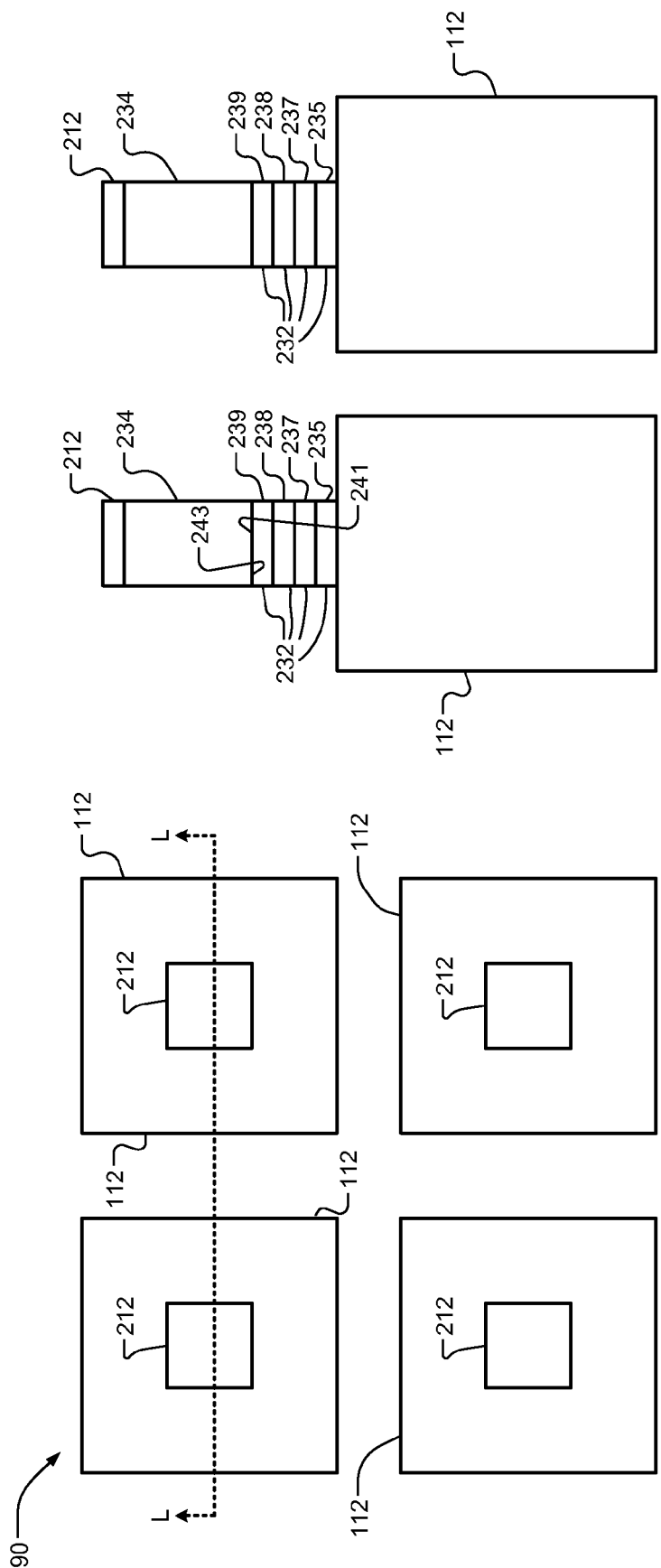
FIG. 26 is a top view of a portion of the RRAM subsequent to etching the resistive layers and the conductive layers.

In accordance to FIG. 3, FIGS. 26-27 show top and cross-sectional views of a state of the portion 90 of the RRAM subsequent to task 230. FIGS. 26-27 show remaining portions 232 of the resistive layers 104, remaining portions 234 of the conductive layer 106, the access devices 112, and the hard mask layer islands 212. At 230, the resistive layers 104 and the conductive layer 106 are etched using the hard mask layer islands 212 as masks. Anisotropic etching may be used to remove exposed portions of the resistive layers 104 and the conductive layer 106 to provide the remaining portions 232, 234. The etching performed at 230 may include wet or dry etching. This provides resistive elements 236 (i.e. the stacks of remaining portions 232, each stack being a resistive element) and conductive elements (i.e. the remaining portions 234) with cross-sectional areas that match each other and cross-sectional areas of the hard mask layer islands 212. Each of the resistive elements includes a first electrode 235, a variable resistance element 237, a metal element 238, and a second electrode 239. The second electrode 239 may be connected to a bit line.

The etching of the resistive layers 104 and the conductive layer 106 as described above provides the resistive elements 236 and the conductive elements 234 with respective contact surfaces that match and are in alignment with each other. An example contact surface of a resistive element is identified as 241. An example contact surface of a conductive element is identified as 243. Patterns including shapes and sizes of each contact surface pair (e.g., the pair of contact surfaces 241, 243) match and are in alignment with each other due to the use of a same corresponding mask. The etching of the resistive layers 104 and the conductive layers 106 occurs during a single task. Thus, the etching of the resistive layers 101 and the etching of conductive layers 106 occur during a same period of time. The contact surfaces have respective contact surface areas that are the same size.

Figure 29:
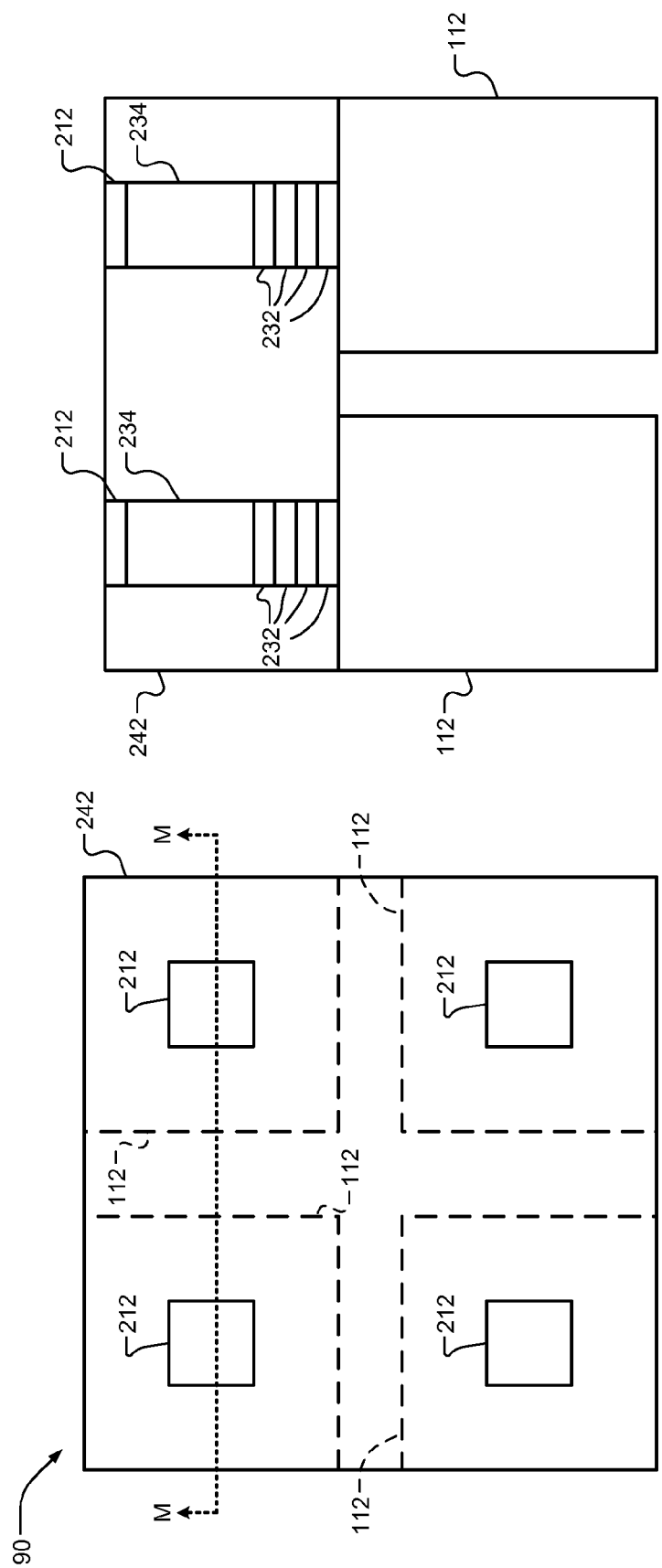
FIG. 29 is a cross-sectional side view through section line N-N of FIG. 28.
Figure 28:
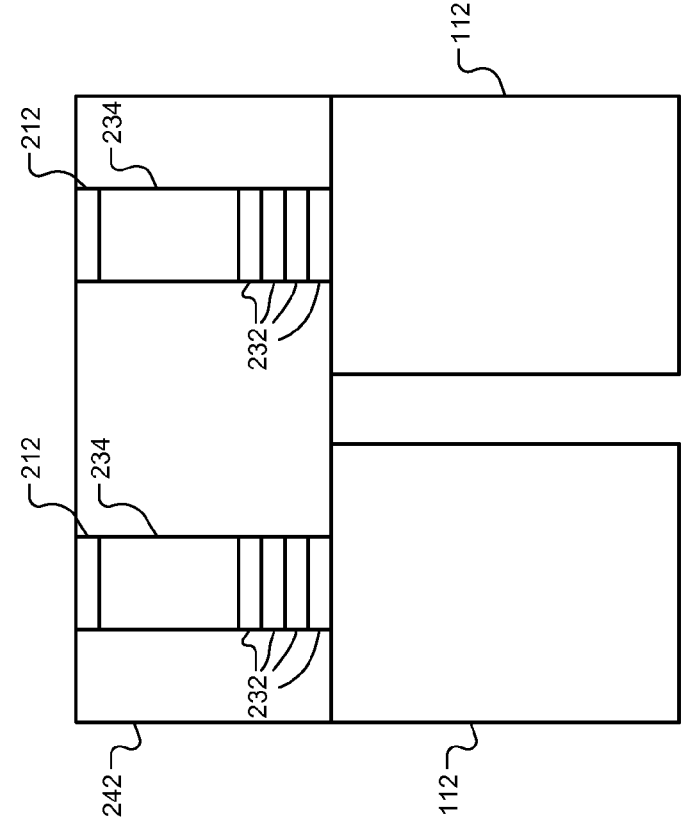
FIG. 28 is a top view of a portion of the RRAM subsequent to applying an isolation layer.

In accordance to FIG. 3, FIGS. 28-29 show top and cross-sectional views of a state of the portion 90 of the RRAM subsequent to task 240. FIGS. 28-29 show the resistive elements 236, the conductive elements 234, the access devices 112, the hard mask layer islands 212, and a dielectric isolation film (or isolation) layer 242. At 240, a dielectric isolation film is deposited over the resistive elements 236 and the conductive elements 234 to provide the isolation layer 242. Portions of resistive elements 236 and the conductive elements 234 are encapsulated in the dielectric isolation film to isolate the resistive element and the conductive element associated with each stack from other resistive elements and conductive elements of other stacks.

In accordance to FIG. 3, FIGS. 30-31 show top and cross-sectional views of a state of the portion 90 of the RRAM subsequent to task 250. FIGS. 30-31 show the resistive elements 236, the conductive elements 234, the access devices 112, and a dielectric isolation film (or isolation) layer 242. At 250, the hard mask layer islands 212 are removed. Anisotropic etching may be used to remove the hard mask layer islands 212. The etching may include wet or dry etching. Chemical Mechanical Planarization may be used to etch and/or polish a top surface of the RRAM to expose the conductive elements 234.

In accordance to FIG. 3, FIGS. 32-33 show top and cross-sectional views of a state of the portion 90 of the RRAM subsequent to task 260. FIGS. 32-33 show the resistive elements 236, the conductive elements 234, the access devices 112, the isolation layer 242, and interconnections 262. At 260, the interconnections 262 are formed. Metallization may be performed to form the interconnections on portions of the top surface. The interconnections connect two or more of the conductive element 234 to each other. The interconnections may include a metal, such as Ti, aluminum Al, and/or tungsten W. The method may end at 270.

The electrodes 235 of the resistive elements 236 may be connected to transistors. For example only, a single transistor 280 is shown having a drain 282, a source 284 and a gate 286. The drain 282 is connected to one of the electrodes 235. The source 284 may be connected to, for example, a ground reference 288. The gate 286 may be connected to a word line 290.

In the above-described tasks, straight smooth edges of the remainder 162 of the hard mask layer 108 and straight smooth edges of the second spacer 203 provide masks used in etching tasks to provide resistive elements and conductive elements straight smooth edges. The edges of the resistive elements are in alignment with corresponding edges of the conductive elements.

Further aspects of the present invention relates to one or more of the following clauses.

A method is disclosed herein and includes: forming a stack of resistive layers; prior to or subsequent to forming the stack of resistive layers, forming a conductive layer; applying a mask layer on (i) the stack of resistive layers, or (ii) the conductive layer; forming a first spacer on the mask layer; and etching away a first portion of the mask layer using the first spacer as a first mask to provide a remainder. The method further includes: forming a second spacer on (i) the stack of the resistive layers or the conductive layer, and (ii) the remainder of the mask layer; etching away a second portion of the remainder of the mask layer to form an island; and using the island as a second mask, (i) etching the stack of the resistive layers to form a resistive element of a memory, and (ii) etching the conductive layer to form a conductive element of the memory.

The forming of the first spacer may include: applying first film layers on the mask layer; and etching the first film layers to provide the first spacer. The forming of the second spacer may include: applying second film layers on (i) the mask layer, and (ii) the stack of the resistive layers or the conductive layer; and etching the second film layers to provide the second spacer. The first spacer and the second spacer may each be ring-shaped.

The forming of the second spacer may include: applying film layers on (i) the mask layer, and (ii) the stack of the resistive layers or the conductive layer; and etching the film layers to provide the second spacer.

The method may further include: etching away the second portion of the remainder of the mask layer to form islands; and using the islands as masks, (i) etching the stack of the resistive layers to form resistive elements, and (ii) etching the conductive layer to form conductive elements.

The method may further include: depositing an isolation material over the resistive elements and the conductive elements to encapsulate (i) a portion of the stack of the resistive elements, and (ii) a portion of the conductive elements; exposing the conductive elements by etching away (i) the islands, and (ii) a portion of the isolation material; and performing metallization to form an interconnection connecting two or more of the conductive elements.

The method may further include: depositing an isolation material over the resistive element and the conductive element to encapsulate (i) a portion of the resistive element, and (ii) a portion of the conductive element; and exposing the conductive element by etching away (i) a portion of the isolation material, and (ii) the island.

As an example, the stack of resistive layers may be formed on access devices. The access devices may include a transistor and a word line. The resistive element includes a first electrode and a second electrode. The first electrode is connected to a drain of the transistor. The second electrode is connected to a bit line.

As another example, the conductive layer is formed prior to the forming of the stack of the resistive layers; and the conductive element is a contact.

As an example, the conductive layer is formed subsequent to the forming of the stack of the resistive layers; and the conductive element is a via.

A method is disclosed herein and includes: forming a stack of resistive layers on access devices; applying a conductive layer on the stack of the resistive layers; applying a mask layer on the conductive layer; forming spacers on the mask layer; etching the mask layer using the spacers as first masks to provide islands; and using the islands as second masks, (i) etching the stack of the resistive layers to form resistive elements, and (ii) etching the conductive layer to form conductive elements, where the resistive elements provide memory cells.

The method may further include: forming first film layers on the mask layer; etching the first film layers to form a first spacer; etching away a first portion of the mask layer using the first spacer as a mask to provide a remainder; forming second film layers to form a second spacer on (i) the conductive layer, and (ii) the remainder of the mask layer; and etching away a second portion of the remainder of the mask layer to form the islands.

The method may further include: depositing an isolation material over the stack of the resistive elements and the conductive elements to encapsulate (i) a portion of the resistive elements, and (ii) a portion of the conductive elements; and exposing the conductive elements by etching away (i) the islands, and (ii) a portion of the isolation material; and performing metallization to form an interconnection connecting two or more of the conductive elements.

A memory is disclosed herein and includes resistive elements and conductive elements. The resistive elements provide an array of memory cells, where the resistive elements include first contact surfaces. The conductive elements include vias or contacts. The conductive elements include second contact surfaces. The, resistive elements are in contact with respective ones of the conductive elements to provide element pairs. The element pairs have been etched during a same period of time using a single mask for each of the element pairs. The second contact surfaces match and are in alignment with respective ones of the first contact surfaces as a result of the etching of the element pairs.

As an example, contact surfaces areas of the second contact surfaces may have same sizes as corresponding contact surface areas of the first contact surfaces. Also, each of the stack of the resistive elements may include: a first electrode; a variable resistance in contact with the first electrode; a metallic element in contact with the variable resistance; and a second electrode in contact with the metallic element.

The memory may further include transistors, where: drains of the transistors are connected to the first electrodes of the resistive elements and gates of the transistors are connected to a word line. The second electrodes may be connected to a bit line.

The memory may further include transistors, where each of the transistors is in contact with a respective one of (i) the resistive elements, or (ii) the conductive elements. Electrodes of the resistive elements may be connected to gates of the transistors.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events. Further, although the above tasks are primarily described with respect to RRAM, the above tasks may be applied to other memories.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

Although the terms first, second, third, etc. may be used herein to describe various layers, interconnections, elements, access devices, and/or components, these items should not be limited by these terms. These terms may be only used to distinguish one item from another item. Terms such as "first," "second," and other numerical terms when used herein do not imply a sequence or order unless clearly indicated by the context. Thus, a first item discussed below could be termed a second item without departing from the teachings of the example implementations.

In the following description, various terms are used to describe the physical relationship between components. When a first element is referred to as being "on", "engaged to", "connected to", "disposed on", "applied on", or "coupled to" a second element, the first element may be directly on, engaged, connected, disposed, applied, or coupled to the second element, or intervening elements may be present. In contrast, when an element is referred to as being "directly on", "directly engaged to", "directly disposed on", "directly applied on", "directly connected to", or "directly coupled to" another element, there may be no intervening elements present. Other words used to describe the relationship between elements should be interpreted in a like fashion (e.g., "between" versus "directly between", "adjacent" versus "directly adjacent", etc.).

The apparatuses and methods described in this application may be partially or fully implemented by one or more computer programs executed by one or more processors. The computer programs include processor-executable instructions that are stored on at least one non-transitory, tangible computer-readable medium. The computer programs may also include and/or rely on stored data.

What is claimed is:

1. A method comprising:
   forming a stack of resistive layers;
   prior to or subsequent to forming the stack of resistive layers, forming a conductive layer;
   applying a mask layer on (i) the stack of resistive layers, or (ii) the conductive layer;
   forming a first spacer on the mask layer;
   etching away a first portion of the mask layer using the first spacer as a first mask to provide a remainder;
   forming a second spacer on (i) the stack of the resistive layers or the conductive layer, and (ii) the remainder of the mask layer;
   etching away a second portion of the remainder of the mask layer to form an island; and
   using the island as a second mask, (i) etching the stack of the resistive layers to form a resistive element of a memory, and (ii) etching the conductive layer to form a conductive element of the memory.

2. The method of claim 1, wherein the forming of the first spacer comprises:
   applying a first plurality of film layers on the mask layer; and
   etching the first plurality of film layers to provide the first spacer.

3. The method of claim 2, wherein the forming of the second spacer comprises:
   applying a second plurality of film layers on (i) the mask layer, and (ii) the stack of the resistive layers or the conductive layer; and
   etching the second plurality of film layers to provide the second spacer.

4. The method of claim 1, wherein:
   the first spacer is ring-shaped; and
   the second spacer is ring-shaped.

5. The method of claim 1, wherein the forming of the second spacer comprises:
   applying a plurality of film layers on (i) the mask layer, and (ii) the stack of the resistive layers or the conductive layer; and
   etching the plurality of film layers to provide the second spacer.

6. The method of claim 1, further comprising:
   etching away the second portion of the remainder of the mask layer to form a plurality of islands; and
   using the plurality of islands as a plurality of masks, (i) etching the stack of the resistive layers to form a plurality of resistive elements, and (ii) etching the conductive layer to form a plurality of conductive elements.

7. The method of claim 6, further comprising:
   depositing an isolation material over the plurality of resistive elements and the plurality of conductive elements to encapsulate (i) a portion of the stack of the resistive elements, and (ii) a portion of the plurality of conductive elements;
   exposing the plurality of conductive elements by etching away (i) the plurality of islands, and (ii) a portion of the isolation material; and
   performing metallization to form an interconnection connecting two or more of the plurality of conductive elements.

8. The method of claim 1, further comprising:
   depositing an isolation material over the resistive element and the conductive element to encapsulate (i) a portion of the resistive element, and (ii) a portion of the conductive element; and
   exposing the conductive element by etching away (i) a portion of the isolation material, and (ii) the island.

9. The method of claim 1, wherein:
   the stack of resistive layers are formed on access devices;
   the access devices comprise a transistor and a word line;
   the resistive element comprises a first electrode and a second electrode;
   the first electrode is connected to a drain of the transistor; and
   the second electrode is connected to a bit line.

10. The method of claim 1, wherein:
    the conductive layer is formed prior to the forming of the stack of the resistive layers; and
    the conductive element is a contact.

11. The method of claim 1, wherein:
    the conductive layer is formed subsequent to the forming of the stack of the resistive layers; and
    the conductive element is a via.

12. A method comprising:
    forming a stack of resistive layers on a plurality of access devices;
    applying a conductive layer on the stack of the resistive layers;
    applying a mask layer on the conductive layer;
    forming a plurality of spacers on the mask layer;
    etching the mask layer using the plurality of spacers as a first plurality of masks to provide a plurality of islands; and
    using the plurality of islands as a second plurality of masks, (i) etching the stack of the resistive layers to form a plurality of resistive elements, and (ii) etching the conductive layer to form a plurality of conductive elements, wherein the plurality of the resistive elements provide a plurality of memory cells.

13. The method of claim 12, further comprising:
    forming a first plurality of film layers on the mask layer;
    etching the first plurality of film layers to form a first spacer;
    etching away a first portion of the mask layer using the first spacer as a mask to provide a remainder;
    forming a second plurality of film layers to form a second spacer on (i) the conductive layer, and (ii) the remainder of the mask layer; and
    etching away a second portion of the remainder of the mask layer to form the plurality of islands.

14. The method of claim 12, further comprising:
    depositing an isolation material over the stack of the resistive elements and the plurality of conductive elements to encapsulate (i) a portion of the plurality of resistive elements, and (ii) a portion of the plurality of conductive elements; and exposing the plurality of conductive elements by etching away (i) the plurality of islands, and (ii) a portion of the isolation material; and performing metallization to form an interconnection connecting two or more of the plurality of conductive elements.

15. A memory comprising:

a plurality of resistive elements providing an array of memory cells, wherein the plurality of resistive elements comprise a first plurality of contact surfaces; and a plurality of conductive elements, wherein the plurality of conductive elements comprise a plurality of vias or a plurality of contacts, the plurality of conductive elements comprise a second plurality of contact surfaces, the plurality of resistive elements are in contact with respective ones of the plurality of conductive elements to provide a plurality of element pairs, the plurality of element pairs has been etched during a same period of time using a single mask for each of the plurality of element pairs, and the second plurality of contact surfaces match and are in alignment with respective ones of the first plurality of contact surfaces as a result of the etching of the plurality of element pairs.

16. The memory of claim 15, wherein contact surfaces areas of the second plurality of contact surfaces have same sizes as corresponding contact surface areas of the first plurality of contact surfaces.

17. The memory of claim 15, wherein each of the stack of the resistive elements comprises:

a first electrode;

a variable resistance in contact with the first electrode;

a metallic element in contact with the variable resistance; and a second electrode in contact with the metallic element.

18. The memory of claim 17, further comprising a plurality of transistors, wherein:

drains of the plurality of transistors are connected to the first electrodes of the plurality of resistive elements;

gates of the plurality of transistors are connected to a word line; and the second electrodes are connected to a bit line.

19. The memory of claim 15, further comprising a plurality of transistors, wherein each of the plurality of transistors is in contact with a respective one of (i) the plurality of resistive elements, or (ii) the plurality of conductive elements.

20. The memory of claim 19, wherein electrodes of the plurality of resistive elements are connected to gates of the plurality of transistors.

* * * * *